United States Patent
Selvamanickam et al.

(10) Patent No.: US 8,512,798 B2
(45) Date of Patent: Aug. 20, 2013

(54) PLASMA ASSISTED METALORGANIC CHEMICAL VAPOR DEPOSITION (MOCVD) SYSTEM

(75) Inventors: Venkat Selvamanickam, Wynantskill, NY (US); Hee-Gyoun Lee, Guilderland, NY (US)

(73) Assignee: SuperPower, Inc., Schenectady, NY (US)

( * ) Notice: Subject to any disclaimer, the term of this patent is extended or adjusted under 35 U.S.C. 154(b) by 649 days.

(21) Appl. No.: 10/456,732

(22) Filed: Jun. 5, 2003

(65) Prior Publication Data
US 2004/0247779 A1     Dec. 9, 2004

(51) Int. Cl.
  *B05D 5/12* (2006.01)
  *C23C 16/00* (2006.01)
  *H05H 1/00* (2006.01)

(52) U.S. Cl.
  USPC ........ 427/62; 427/255.32; 427/571; 427/575; 427/584; 427/586

(58) Field of Classification Search
  USPC ................. 427/255.32, 571, 575, 584, 586, 427/62
  See application file for complete search history.

(56) References Cited

U.S. PATENT DOCUMENTS

| | | | | |
|---|---|---|---|---|
| 5,162,296 A * | 11/1992 | Yamazaki | | 505/400 |
| 5,447,569 A | 9/1995 | Hiskes et al. | | |
| 5,653,806 A * | 8/1997 | Van Buskirk | | 118/715 |
| 5,820,678 A | 10/1998 | Hubert et al. | | |
| 6,066,204 A | 5/2000 | Haven | | |
| 6,289,842 B1 | 9/2001 | Tompa | | |
| 6,338,759 B1 | 1/2002 | Yu et al. | | |
| 2004/0016401 A1 | 1/2004 | Ignatiev et al. | | |
| 2004/0023810 A1 | 2/2004 | Ignatiev et al. | | |
| 2004/0168636 A1 * | 9/2004 | Savvides et al. | | 118/723 CB |

FOREIGN PATENT DOCUMENTS

| | | | |
|---|---|---|---|
| CN | 1045658 A | | 9/1990 |
| EP | 334374 | * | 9/1989 |
| EP | 0 744 474 A1 | | 11/1996 |
| JP | 01-104774 | * | 4/1989 |
| JP | 1242496 | | 9/1989 |
| JP | 03050193 | | 4/1991 |
| JP | 3093608 A | | 4/1991 |
| JP | 05-51748 | * | 3/1993 |
| JP | 7206592 A | | 8/1995 |

(Continued)

OTHER PUBLICATIONS

Singh et al., "Reduced thermal budget processing of Y-Ba-Cu-O by rapid isothermal processing assisted metalorganic chemical vapor deposition", Journal of Applied Physics, vol. 69(4), Feb. 15, 1991, pp. 2418-2422.*

(Continued)

*Primary Examiner* — Brian K Talbot
(74) *Attorney, Agent, or Firm* — Abel Law Group, LLP

(57) ABSTRACT

The present invention is a high-throughput, ultraviolet (UV) assisted metalorganic chemical vapor deposition (MOCVD) system for the manufacture of HTS-coated tapes. The UV-assisted MOCVD system of the present invention includes a UV source that irradiates the deposition zone and improves the thin film growth rate. The MOCVD system further enhances the excitation of the precursor vapors and utilizes an atmosphere of monatomic oxygen (O) rather than the more conventional diatomic oxygen ($O_2$) in order to optimize reaction kinetics and thereby increase the thin film growth rate. In an alternate embodiment, a microwave plasma injector is substituted for the UV source.

13 Claims, 2 Drawing Sheets

(56) References Cited

FOREIGN PATENT DOCUMENTS

| | | |
|---|---|---|
| JP | 2002146532 A | 5/2002 |
| JP | 2003512715 A | 4/2003 |
| JP | 2005534157 | 11/2005 |
| JP | 2006513553 | 4/2006 |
| WO | 00/34549 | 6/2000 |

OTHER PUBLICATIONS

P.C. Chou, et al. "Optimization of JC of YBCO Films Prepared by Photo-Assisted MOCVD Through Statistical Robust Design" Physica C 254 (1995) pp. 93-112.

* cited by examiner

PLASMA ASSISTED METALORGANIC CHEMICAL VAPOR DEPOSITION (MOCVD) SYSTEM

FIELD OF THE INVENTION

The present invention relates to high-throughput metalorganic chemical vapor deposition (MOCVD) of high-temperature superconducting (HTS) coated wire. More specifically, the present invention relates to MOCVD systems incorporating an ultraviolet (UV) or microwave source of radiation to assist in chemical vapor deposition (CVD).

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century.

HTS wire offers best-in-class performance, carrying over one hundred times more current than conventional copper and aluminum conductors of the same physical dimension do. The superior power density of HTS wire will enable a new generation of power industry technologies. It offers major size, weight, and efficiency benefits. HTS technologies will drive down costs and increase the capacity and reliability of electric power systems in a variety of ways. For example, HTS wire is capable of transmitting two to five times more power through existing rights of way. This new cable will offer a powerful tool to improve the performance of power grids while reducing their environmental footprint. However, to date only short samples of the HTS-coated tape used in the manufacture of next-generation HTS wires have been fabricated at high performance levels. In order for HTS technology to become commercially viable for use in the power generation and distribution industry, it will be necessary to develop techniques for continuous, high-throughput production of HTS-coated tape.

MOCVD is a deposition process that shows promise for the high throughput necessary to cost-effectively produce HTS-coated tapes. During MOCVD, HTS film, such as yttrium-barium-copper-oxide ($YBa_2Cu_3O_7$, or YBCO) may be deposited by vapor-phase precursors carried by an inert gas to a heated buffered metal substrate via chemical reactions that occur at the surface of the substrate.

Hubert, et al., U.S. Pat. No. 5,820,678, dated Oct. 13, 1998 and entitled "Solid Source MOCVD System," describes a system for MOCVD fabrication of superconducting and non-superconducting oxide films that includes a delivery system for the feeding of metalorganic precursors for multi-component chemical vapor deposition. The precursors can be ground at a desired rate and fed to a vaporization zone and then to a reaction zone within a deposition chamber for thin film deposition. However, the throughput achievable by the process of Hubert et al. is greatly limited. The substrate upon which MOCVD occurs is fixedly attached, e.g., with a thermally conductive paste, to a substrate holder throughout the deposition process. As a result, discontinuous deposition runs characterize the MOCVD Hubert et al.'s process, which greatly limits the yields achievable through such a process.

Attempts have been made to increase the deposition efficiency of MOCVD processes. Tompa, U.S. Pat. No. 6,289,842, dated Sep. 18, 2001, and entitled "Plasma Enhanced Chemical Vapor Deposition System" discloses an rf plasma generating system to enhance the deposition process in a discontinuous wafer coating system. Hubert, et al., U.S. Pat. No. 5,820,678, provides coils connected to a 13.54 MHz generator wrapped around the injection cone of the vaporized reactants to produce an rf plasma and enhance the chemical reactions as the gas mixture arrives at the reaction zone within the deposition chamber.

P. C. Chou, et al., "Optimization of $J_c$ of YBCO films prepared by photo-assisted MOCVD through statistical robust design," Physica C 254 (1995) 93-112] discloses the achievement of a high deposition rate (one micron per minute) of yttrium-barium-copper-oxide (YBCO) film using photo-assisted CVD. Chou, et al. utilizes a diatomic oxygen atmosphere and a halogen lamp that emits a wide range of electromagnetic radiation (including both UV and infrared (IR) radiation) and relies upon the halogen lamp to heat the substrates (IR) as well as the precursors (UV) entering the deposition zone to enhance reaction kinetics, which often results in premature precursor decomposition. Chou, et al.'s process is neither scalable nor reproducible, and is not well suited to continuous deposition onto extended lengths of substrate; the research is therefore not compatible with a high-throughput MOCVD process.

Microwave plasma-enhanced chemical vapor deposition (PECVD) of yttrium-stabilized zirconia (YSZ) thin films research has been published by B. Preauchat et al., "Performances of microwave PECVD reactor or thin and thick oxide coatings at extremely high deposition rate", Proceedings of the 8$^{th}$ International Plama Surface Engineering Conference, (2001)109-115). B. Preauchat et al's system includes a deposition chamber formed by walls of quartz. This requires high temperature glassware work and makes it difficult to construct a system for continuous deposition of long length wire.

A better approach to a large-scale MOCVD system utilizes a reel-to-reel spooling system that translates a plurality of buffered metal substrate tapes through an MOCVD chamber. The substrate tapes translate side by side, entering and exiting the MOCVD chamber through slits in the chamber walls, and undergo thin film deposition therein. A radiant substrate heater and a showerhead may be sized appropriately to create a large range of deposition zone areas so as to accommodate thin film deposition over a large zone onto the multiple translating substrate tapes. In addition to a large deposition zone, the other main factor that affects throughput is the thin film growth rate in the MOCVD process.

Complex reaction kinetics govern the thin film growth rate achievable in such a process to a great extent. Factors contributing to these complex reaction kinetics include the chamber pressure, the substrate temperature, the oxygen content and its method of introduction to the deposition zone, the amount of precursors being supplied to the deposition zone (determined by both the precursor molarity and the mass flow rate of the precursor vapors and their inert carrier gas through the showerhead assembly), the temperature at which the precursors are maintained prior to their introduction into the deposition zone, and the exhaust efficiency of the reaction byproducts away from the deposition zone.

It is therefore an object of the invention to provide an improved throughput continuous MOCVD system by enhancing reaction kinetics utilizing an energy source in the deposition zone.

It is therefore an object of the invention to provide an improved throughput continuous MOCVD system by enhancing reaction kinetics utilizing a UV or microwave energy source in the deposition zone.

It is therefore an object of the invention to provide an improved throughput continuous MOCVD system having enhanced utilization efficiency of precursors during the deposition of superconducting thin films.

It is another object of the invention to provide an improved throughput continuous MOCVD system by enhancing reaction kinetics by providing a monoatomic oxygen (O) atmosphere within the deposition zone,

SUMMARY OF THE INVENTION

The problems associated with prior art processes for depositing thin YBCO films are minimized in the disclosed process by utilizing an auxiliary energy source in the deposition zone of the MOCVD reactor coupled with the provision of a nitrous oxide and diatomic oxygen injected into the deposition zone through a showerhead to deposit a film upon the surface of multiple continuously translating metallic substrates.

DETAILED DESCRIPTION OF THE INVENTION

In its primary embodiment the present invention is a high-throughput, UV-assisted MOCVD system for the manufacture of HTS-coated tapes. The UV-assisted MOCVD system of the present invention includes a UV source that irradiates the deposition zone and improves the thin film growth rate. The MOCVD system further utilizes a monatomic oxygen (O) atmosphere as opposed to the more conventional diatomic oxygen ($O_2$) to optimize reaction kinetics and thereby increase the thin film growth rate.

The present invention discourages or eliminates by-reactions that may occur during the extended deposition runs that characterize such a high-throughput continuous MOCVD system. Using monatomic oxygen, which lowers the deposition temperature necessary for the optimum growth of thin film, minimizes these undesirable by-reactions between the metal substrate and the YBCO thin film.

Figure 1:
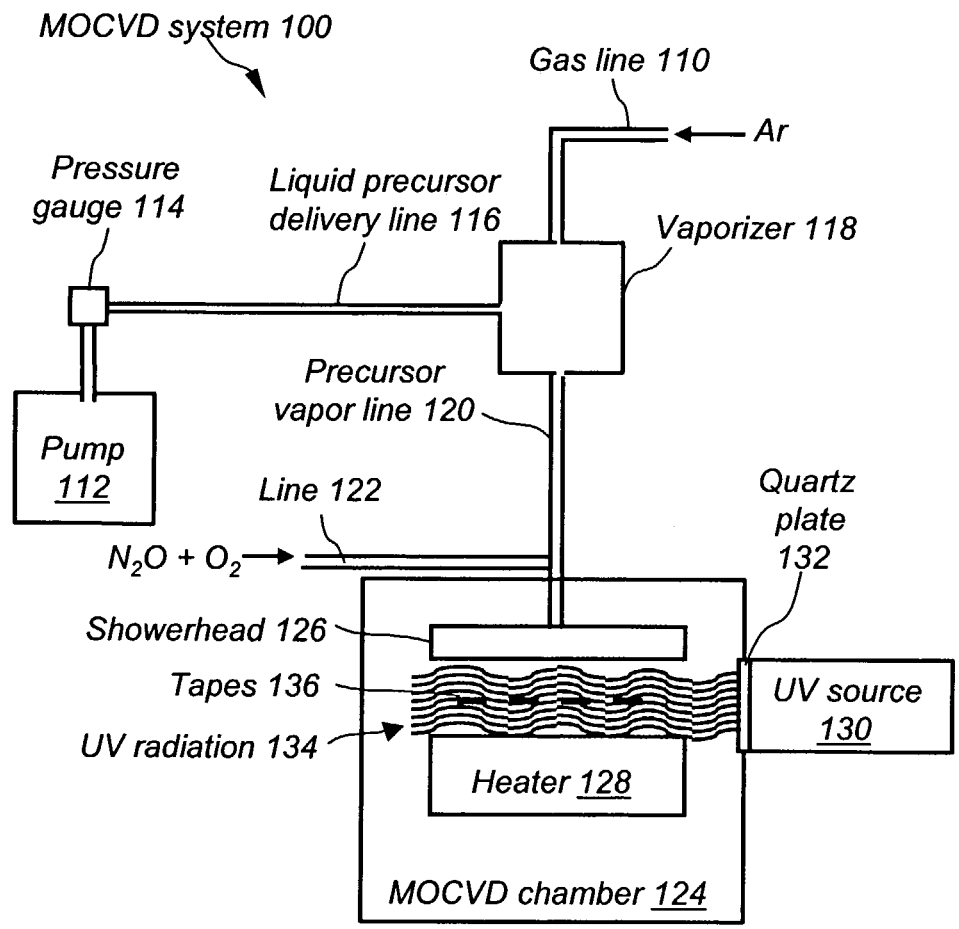
FIG. 1 illustrates a UV-assisted MOCVD system in accordance with the invention.

FIG. 1 illustrates a high-throughput, UV-assisted MOCVD system 100 in accordance with the invention. The MOCVD system 100 includes a gas line 110 and a liquid precursor delivery line 116 feeding a vaporizer 118. A pump 112 is connected to the liquid precursor delivery line 116, and a pressure gauge 114 is disposed along the liquid precursor delivery line 116. The gas line 110 is a tube or pipe through which an inert carrier gas, such as argon or nitrogen, passes. The liquid precursor delivery line 116 is a tube or pipe through which a solution containing organometallic precursors, such as yttrium, barium, and copper, along with an appropriate mixture of solvents, passes between the pump 112 and the vaporizer 118. The pump 112 is a liquid precursor delivery pump capable of a low flow rate between 0.1 and 10 mL/min. The pump 112 is a high-pressure, low flow rate pump, such as a high-pressure liquid chromatography (HPLC) pump. The pressure gauge 114 is a sensing device that monitors the delivery pressure of the liquid precursor solution prior to its entrance into the vaporizer 118. The vaporizer 118 is an element in which the precursor solution is flash vaporized and is mixed with the inert carrier gas for delivery via a precursor vapor line 120 to a showerhead 126.

A line 122, which is a tube or pipe through which nitrous oxide ($N_2O$) and diatomic oxygen ($O_2$) pass, opens into the precursor vapor line 122 between the vaporizer 118 and the showerhead 126. The showerhead 126 is an element known in the art that enables a uniform distribution of vapor over a given area, and may assume a stainless steel form composed of an upper and lower flange clamped together with a plurality of bolts and seal formed therein by a gasket. A plurality of orifices are machined through the lower flange and arranged as a series of evenly spaced fine openings.

In an alternate embodiment, the showerhead 126 may include multiple isolated compartments that are fed by multiple precursor vapor lines in such a way as to enable the deposition of multi-layer coated tape, having alternating thin films of, for example, YBCO and samarium-barium-copper-oxide ($SmBa_2Cu_3O_7$ or "Sm123").

Housed within an MOCVD chamber 124 are the showerhead 126 and a substrate heater 128 disposed with respect to one another to create a deposition zone in the region of space directly therebetween.

One or more tapes 136 are made to translate through the deposition zone. The tapes 136 are flexible lengths of substrate formed from a variety of metals, such as stainless steel or a nickel alloy such as Inconel, upon which buffer layers, such as yttria-stabilized zirconia (YSZ) and/or cerium oxide ($CeO_2$) have been previously deposited with a bi-axial texture, for instance, (100)<001> cube texture. The tapes 136 are capable of withstanding temperatures around 900° C. and have dimensions that may vary to meet the desired finished product and system limitations. For example, the tapes 136 may have a thickness of 25 microns, a width of 1 cm, and a length of 100 meters.

The heater 128 is a well-known single or multiple zone substrate heater that provides heating, typically in the range of about 700 to about 950° C., to the substrate tapes 136 via a radiant heating element, such as a lamp. Alternatively, the heater 128 is a resistance heater that utilizes a heating element such as Kanthal or $MoSi_2$. The MOCVD chamber 124 is a vacuum-sealed deposition chamber in which an MOCVD process occurs, such as a cold-wall reactor that may be maintained at a pressure in the range of 1 Torr to 50 Torr, for example, 3.2 Torr.

The deposition zone defined by the dimensions of the showerhead 126 and the heater 128 may enable deposition onto, for example, thirty translating tapes 136 evenly spaced approximately two millimeters apart.

Disposed external to the MOCVD chamber 124 is a UV source 130 that emits UV radiation 134 through a quartz plate 132 disposed within a side wall of the MOCVD chamber 124 such that the UV radiation 134 is directed into the deposition zone. The IJV source 130 includes a housing internal to which an element such as one or more lamps emits UV radiation 134 having a wavelength between about 100 nm and 350 nm, with a preferred wavelength of 172 nm. The UV source 130 is characterized by a power rating between about 500 W and 20 kW, with a preferred power of about 10 kW. The UV source 130 is sized appropriately to correspond to the deposition zone created between the showerhead 126 and the heater 128 and, as a result, may include a number of lamps that enable irradiation of the entire deposition zone. The quartz plate 132 is a window through which UV radiation 134 may be transmitted with a low degree of absorption or reflection to the MOCVD chamber 124.

Additionally, a plurality of thermocouples and sensors (not shown) are likely disposed at strategic locations throughout the MOCVD system 100.

The MOCVD system 100 is characterized by increased throughput over traditional MOCVD systems, and is capable of the continuous deposition of the superconducting YBCO or other FITS film onto the plurality of translating tapes 136. In operation, the pump 112 delivers a solution stored at room temperature containing the organometallic precursors, such as tetramethyl heptanedionate compounds of yttrium, barium, and copper, along with an appropriate mixture of solvents, such as tetrahydrofuran and isopropanol, to the vaporizer 118 via the liquid precursor delivery line 116. The barium compound is likely to be adducted with a compound such as phenanthroline to assure long-term stability especially under a moisture-containing atmosphere.

Upon its introduction to the vaporizer 118, the solution is flash vaporized instantly, within a temperature range of 230 to 300° C., preferably approximately 240° C. An inert carrier gas, such as argon or nitrogen, enters the vaporizer 118 via the gas line 110, mixes with the organometallic precursor vapors, and delivers the precursor vapors to the showerhead 126 via the precursor vapor line 120.

Nitrous oxide ($N_2O$) and diatomic oxygen ($O_2$) are then introduced to the precursor vapors and their inert carrier gas via a line 122 that empties into the precursor vapor line 120 between the vaporizer 118 and the showerhead 126 at a point near to the showerhead 118 so as to prevent premature decomposition of the precursors and thereby reduce the occurrence of film accumulation within the precursor vapor line 120 and the showerhead 126. The nitrous oxide, the diatomic oxygen, and the precursor vapors with their inert carrier gas are delivered to the MOCVD chamber 124 via the precursor vapor line 120 and, upon reaching the showerhead 126, are injected uniformly over the entire deposition zone.

The showerhead 126 and the heater 128 are disposed with respect to one another at an optimal distance of, for example, 29 mm to allow the tapes 136 to pass therebetween while achieving the necessary heating and vapor delivery. In one embodiment of the invention, a shutter (not shown) is provided and may open once the heater 128 ramps up to its optimum operating power. As the tapes 136 translate through the deposition zone, they are elevated in temperature by the substrate heater 128 to approximately 780° C. As the heated tapes 136 are exposed to the vapor-phase precursor composition, a thin film of YBCO may be deposited thereon, as the organics once linked to the yttrium, barium, and copper separate and are pumped away from the deposition zone in the form of $CO_2$, $H_2O$, and $NO_2$.

During the deposition process, the UV source 130 emits, through the quartz plate 132, UV radiation 134 that floods the deposition zone. The nitrous oxide ($N_2O$) and diatomic oxide ($O_2$) gas injected with the precursor vapors and their inert carrier gases into the deposition zone through the showerhead 126 react with the UV radiation 134 and decompose into nitrous monoxide (NO) and monatomic oxygen (O). Since monatomic oxygen is a more efficient reactant gas than diatomic oxygen for the formation of YBCO thin films, the production of the films is enhanced. Further, the precursor vapors absorb energy from the UV radiation 134, become excited to a higher energy state, and more readily break down to deposit the desired YBCO thin film atop the tapes 136 as compared to simply reacting with the oxygen and coming into contact with the heated tapes 136.

While the process is not entirely understood, the combination of the monatomic oxygen atmosphere within the deposition zone and the excitation of the precursor vapors to a higher energy state as a result of flooding the deposition zone with UV radiation 134 enables a more efficient thin film growth to occur in the MOCVD system 100. Further, the utilization of the UV source 130 to create a monoatomic oxygen atmosphere within the deposition zone enables thin film deposition to occur at a lower substrate temperature, enabling a lower power heater 128 and, further, reducing the likelihood of chemical reactions taking place between the metal substrate and the YBCO thin film deposited thereon that may occur under the prolonged exposure to high temperatures that characterize a high-throughput, continuous MOCVD process.

In another embodiment, UV lamps capable of withstanding high ambient temperatures are installed within the MOCVD chamber 124. These lamps may be arranged in a line along the length of the showerhead 126, with a reflector behind them to focus the UV radiation on the tapes 136.

Figure 2:
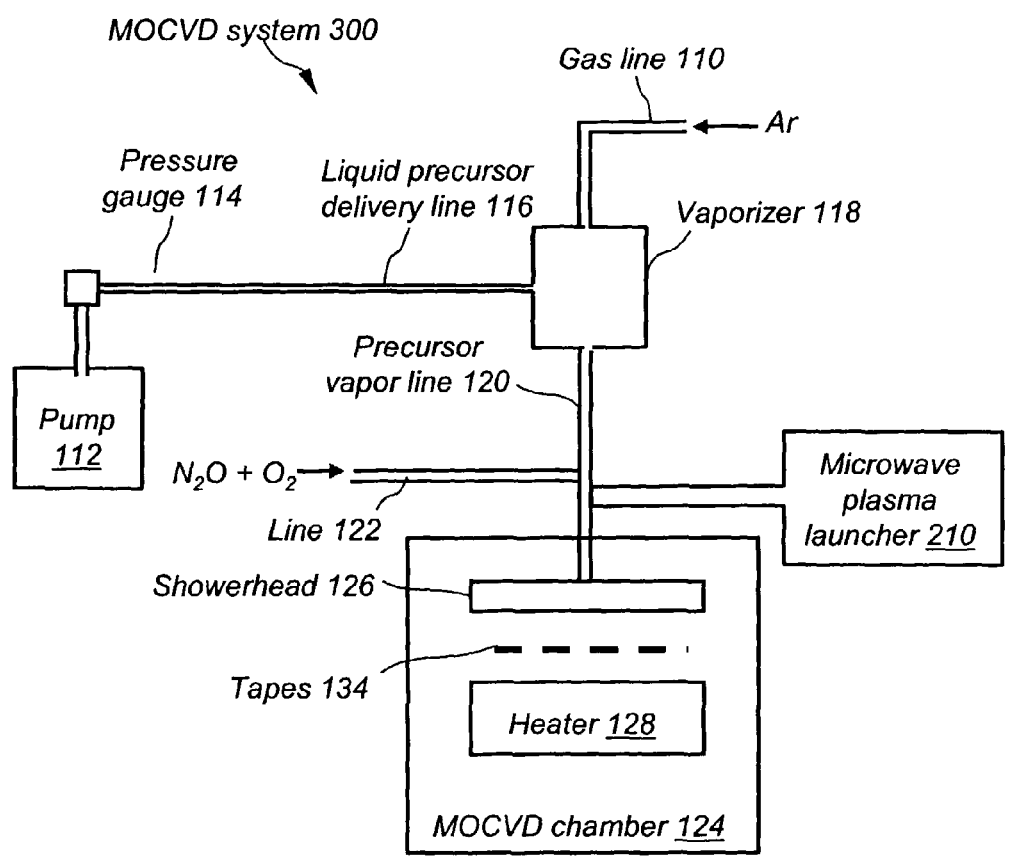
FIG. 2 illustrates a plasma-assisted MOCVD system in accordance with the invention.

FIG. 2 shows an MOCVD system 200 that includes elements identical or similar to elements described in reference to FIG. 1, including the gas line 110, the pump 112, the pressure gauge 114, the liquid precursor delivery line 116, the vaporizer 118, the precursor vapor line 120, the line 122, the MOCVD chamber 124, the showerhead 126, the heater 128, and the tapes 134.

Additionally, the MOCVD system 200 includes a microwave plasma launcher 210 in place of the UV source 130. Microwave radiation is generated in the microwave plasma launcher 210 and is introduced to the precursor vapor line 120 at a point prior to the showerhead 126. The microwave plasma launcher 210 includes a source of microwave radiation that is characterized by a power between about 100 W and 20 kW, with a preferred power of about 10 kW, and a frequency of, for example, 2.45 GHz.

In operation, microwave-generated plasma is introduced to the precursor vapor line 120 via the microwave plasma launcher 210 in such a way that a homogenous mixing occurs between the precursor vapors, their inert carrier gas, the $N_2O$ and $O_2$, and the microwave plasma. The $N_2O$ and $O_2$ that are delivered with the precursor vapors and their inert carrier gas decompose into NO and O, thereby providing an atmosphere of monoatomic oxygen within the deposition zone that enhances reaction kinetics and improves thin film growth rates within the MOCVD system 200. The reaction kinetics are further enhanced by the excitation of the precursor vapors by the microwave plasma, and result in an improved thin film growth rate for the same reasons described in reference to FIG. 1.

In an alternate embodiment, the microwave plasma launcher 210 injecs the microwave plasma directly into the MOCVD chamber 124 through a window disposed in the wall of MOCVD chamber 124, and thereby generates a plasma envelope within the deposition zone. However, in this embodiment a less homogenous mixing occurs between the precursor vapors and the microwave plasma.

The invention claimed is:

1. A process for the continuous high throughput preparation of high temperature superconducting tape utilizing metalorganic vapor deposition comprising:
   providing single or multiple strands of a substrate, the substrate strands having a major surface and having a biaxial buffer layer deposited thereon;
   threading the substrate strands through a MOCVD reactor;

providing a source of superconducting precursor composition in vapor form, the superconducting precursor composition including an organometallic precursor;

mixing the superconducting precursor composition in vapor form with an inert carrier gas;

combining the vaporized precursor composition and inert carrier gas mixture with nitrous oxide and diatomic oxygen;

translating the substrate strands through a deposition zone in the MOCVD chamber where the deposition zone is defined by the space between a showerhead and a substrate heater disposed below the showerhead, where the substrate strands translate over the substrate heater, the substrate heater heats the substrate to a temperature of from about 700° C. to about 950° C., and the major surface of the substrate strands face the showerhead;

providing an energy source separate from the substrate heater, and directing microwave energy into the deposition zone and parallel to the major surface of the substrate strands and parallel to the biaxial buffer layer, where the energy provided is at least 10 kW of power to cause the diatomic oxygen to react and form monoatomic oxygen and to excite the organometallic precursor molecules to a high energy state, where the energy source is disposed within the MOCVD reactor;

introducing the combined gases and vapors into the MOCVD reactor through the showerhead; and reacting the precursor vapor in the deposition zone to form a superconducting composition overlying the biaxial buffer layer of the substrate.

2. The process of claim 1 where a single strand of substrate is provided and the single strand of substrate is slit into multiple strands after coating.

3. The process of claim 1 where the MOCVD reactor is a cold wall reactor.

4. The process of claim 1 where the pressure within the MOCVD reactor is in the range of 1 to 50 Torr.

5. The process of claim 1 where the substrates are metallic and have a biaxial buffer layer deposited upon them.

6. The process of claim 1 where the energy source produces radiation at a wavelength in the range of from about 2 to about 4 GHz.

7. A process for the continuous high throughput preparation of high temperature superconducting tape utilizing metalorganic vapor deposition comprising:

providing a single strand of a substrate, the substrate strand having a major surface and having a biaxial buffer layer deposited thereon;

threading the substrate strands through a MOCVD reactor;

providing a source of superconducting precursor composition in vapor form, the superconducting precursor composition including an organometallic precursor;

mixing the superconducting precursor composition in vapor form with an inert carrier gas;

combining the vaporized precursor composition and inert carrier gas mixture with nitrous oxide and diatomic oxygen;

translating the substrate strands through a deposition zone in the MOCVD chamber where the deposition zone is defined by the space between a showerhead and a substrate heater disposed below the showerhead, where the substrate strands translate over the substrate heater, the substrate heater heats the substrate to a temperature of from about 700° C. to about 950° C., and the major surface of the substrate strands face the showerhead;

providing an energy source separate from the substrate heater, and directing microwave energy into the deposition zone and parallel to the major surface of the substrate strands and parallel to the biaxial buffer layer, where the energy provided is at least 10 kW of power to cause the diatomic oxygen to react and form monoatomic oxygen and to excite the organometallic precursor molecules to a high energy state;

introducing the combined gases and vapors into the MOCVD reactor through the showerhead;

reacting the precursor vapor in the deposition zone to form a superconducting composition overlying the biaxial buffer layer of the substrate; and slitting the single strand of substrate comprising the biaxial buffer layer and the superconducting composition into multiple strands.

8. The process of claim 7 where the energy source is disposed externally to the MOCVD reactor.

9. The process of claim 7 where the energy source is disposed within the MOCVD reactor.

10. The process of claim 7 where the MOCVD reactor is a cold wall reactor.

11. The process of claim 7 where the pressure within the MOCVD reactor is in the range of 1 to 50 Torr.

12. The process of claim 7 where the substrates are metallic and have a biaxial buffer layer deposited upon them.

13. The process of claim 7 where the energy source produces radiation at a wavelength in the range of from about 2 to about 4 GHz.

* * * * *